United States Patent
Wang et al.

(10) Patent No.: US 7,301,415 B2
(45) Date of Patent: Nov. 27, 2007

(54) AUTOMATIC FREQUENCY TUNING IN A PHASE LOCK LOOP

(75) Inventors: Chung-Cheng Wang, Taipei Hsien (TW); Chao-Shi Chuang, Tainan Hsien (TW); Wen-Shih Lu, Taipei Hsien (TW); Yu-Chang Chen, Taipei (TW)

(73) Assignee: Airoha Technology Corp., Hsin-Chu (TW)

( * ) Notice: Subject to any disclaimer, the term of this patent is extended or adjusted under 35 U.S.C. 154(b) by 0 days.

(21) Appl. No.: 11/164,924

(22) Filed: Dec. 12, 2005

(65) Prior Publication Data
US 2007/0132517 A1    Jun. 14, 2007

(51) Int. Cl.
*H03B 1/00* (2006.01)
(52) U.S. Cl. .................. 331/179; 331/2; 331/46; 327/156
(58) Field of Classification Search ............. 331/179, 331/2, 46, 175; 327/156
See application file for complete search history.

(56) References Cited

U.S. PATENT DOCUMENTS 6,512,801 B1 * 1/2003 Ninomiya .................... 375/316
6,731,712 B1   5/2004 Lindstrom et al.

* cited by examiner

*Primary Examiner*—Arnold Kinkead
(74) *Attorney, Agent, or Firm*—Winston Hsu

(57) ABSTRACT

A method for automatic frequency tuning in a phase lock loop suitable for use in multi-band VCO wireless systems having very limited initial frequency lock times is disclosed. A predetermined subset of VCOs out of a larger bank of VCOs is selected to serve as interpolation points. The interpolation point VCOs are pre-calibrated with a predetermined voltage and the resultingly generated frequency for each of the interpolation point VCOs is stored into memory as a (frequency, VCO) pair, one pair for each interpolation point VCO. When a desired frequency then is given to the system, an appropriate VCO is selected by interpolation using the (frequency, VCO) pairs of the two most adjacent interpolation points for tracking and locking.

16 Claims, 4 Drawing Sheets

AUTOMATIC FREQUENCY TUNING IN A PHASE LOCK LOOP

BACKGROUND OF THE INVENTION

1. Field of the Invention

The present invention relates to a method of tuning a frequency synthesizer system with multi-band voltage controlled oscillators (VCOs), and more specifically to tuning a wireless frequency synthesizer system with multi-band VCOs having very limited initial frequency lock times.

2. Description of the Prior Art

In a frequency synthesizer system with multi-band voltage controlled oscillators (VCOs), it is required to tune the multi-band VCOs first, before tracking the desired frequency f0. This is done to ensure that the selected VCO covers the desired frequency f0 and that the synthesizer can be locked at f0.

U.S. Pat. No. 6,731,712 issued to Lindstrom et al. discloses one such system where the frequency spectrum is divided into a plurality of ranges with each VCO covering one range. When tuning the system, the upper and lower boundaries of each VCO frequency range is found by recursive scanning, employing smaller and smaller step sizes in both directions away from a center frequency for that VCO. When a specific frequency is later desired, the VCO whose range contains that specific frequency is uniquely selected for tracking and locking.

Please refer to FIG. 1 as an example prior art tuning procedure. In Step 150, a desired frequency f0 is obtained. This is followed in Step 155 by a tuning algorithm similar to that described above. Once the VCOs are tuned, the synthesizer tracks the frequency f0 in Step 170 and the frequency f0 is locked in Step 180 where it remains locked until the frequency changes in Step 190 and the entire process is repeated.

Tuning methods such as this are suitable for most wireless systems because most wireless systems have a much relaxed timing requirement when the channel is changed. However, some wireless systems require the synthesizer to be locked at the desired frequency as quickly as several 10 microseconds and there is no extra time to adopt the prior art VCO tuning procedure.

SUMMARY OF THE INVENTION

The claimed invention solves the above-stated problems and discloses a new and unique method of automatic frequency pre-calibration and synthesis suitable for use in multi-band VCO wireless systems having very limited initial frequency lock times.

To enable very rapid selection of an appropriate VCO to generate the desired frequency, a predetermined subset plurality of VCOs out of a larger bank of VCOs is selected to serve as interpolation points. The interpolation point VCOs are pre-calibrated with a predetermined voltage and the resultingly generated frequency for each of the interpolation point VCOs is stored into memory as a (frequency, VCO) pair, one pair for each interpolation point. When a desired frequency then is given to the system, an appropriate VCO is selected by interpolation using the (frequency, VCO) pairs of the two interpolation points most adjacent to the desired frequency.

The claimed invention saves time by eliminating the need of calibrating each VCO, recursive scanning, and VCO range limitations, achieving improved initial frequency lock times.

These and other objectives of the present invention will no doubt become obvious to those of ordinary skill in the art after reading the following detailed description of the preferred embodiment that is illustrated in the various figures and drawings.

DETAILED DESCRIPTION

In some wireless systems, the synthesizer is required to be locked at the desired frequency so quickly that there is very little time to adopt a tuning procedure. The present invention discloses a method of frequency synthesizing suitable for use in such systems by substantially reducing calibration time by removing the prior art necessity of calibrating each VCO or scanning for frequency ranges of each VCO. As a result, although the VCO selected via the present invention interpolation process may or may not always be the ideal choice for a specific frequency, the selected VCO is capable of generating the specific frequency, and is thusly satisfactory for all purposes while saving a great deal of system limited time. The method comprises pre-calibration of a plurality of VCOs, which are a subset of a larger bank of VCOs within the system and storing the (frequency, VCO) pairs in memory. After pre-calibration of the interpolation point VCOs is completed, one VCO of the bank of VCOs is selected utilizing interpolation of the two (frequency, VCO) pairs most adjacent to the desired frequency and utilized to for tracking and locking.

Figure 1:
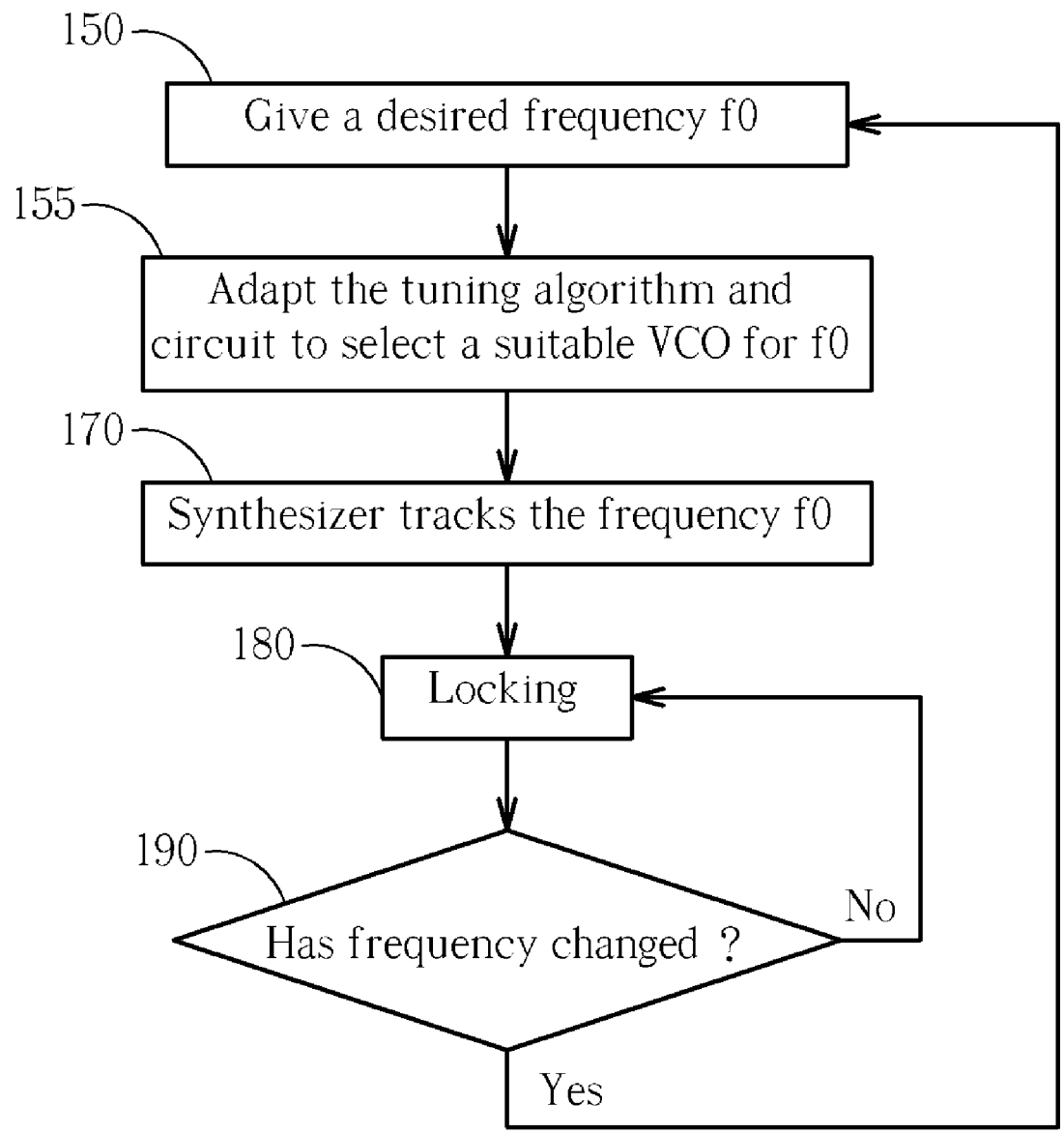
FIG. 1 is a flow chart of automatic frequency tuning according to the prior art.
Figure 2:
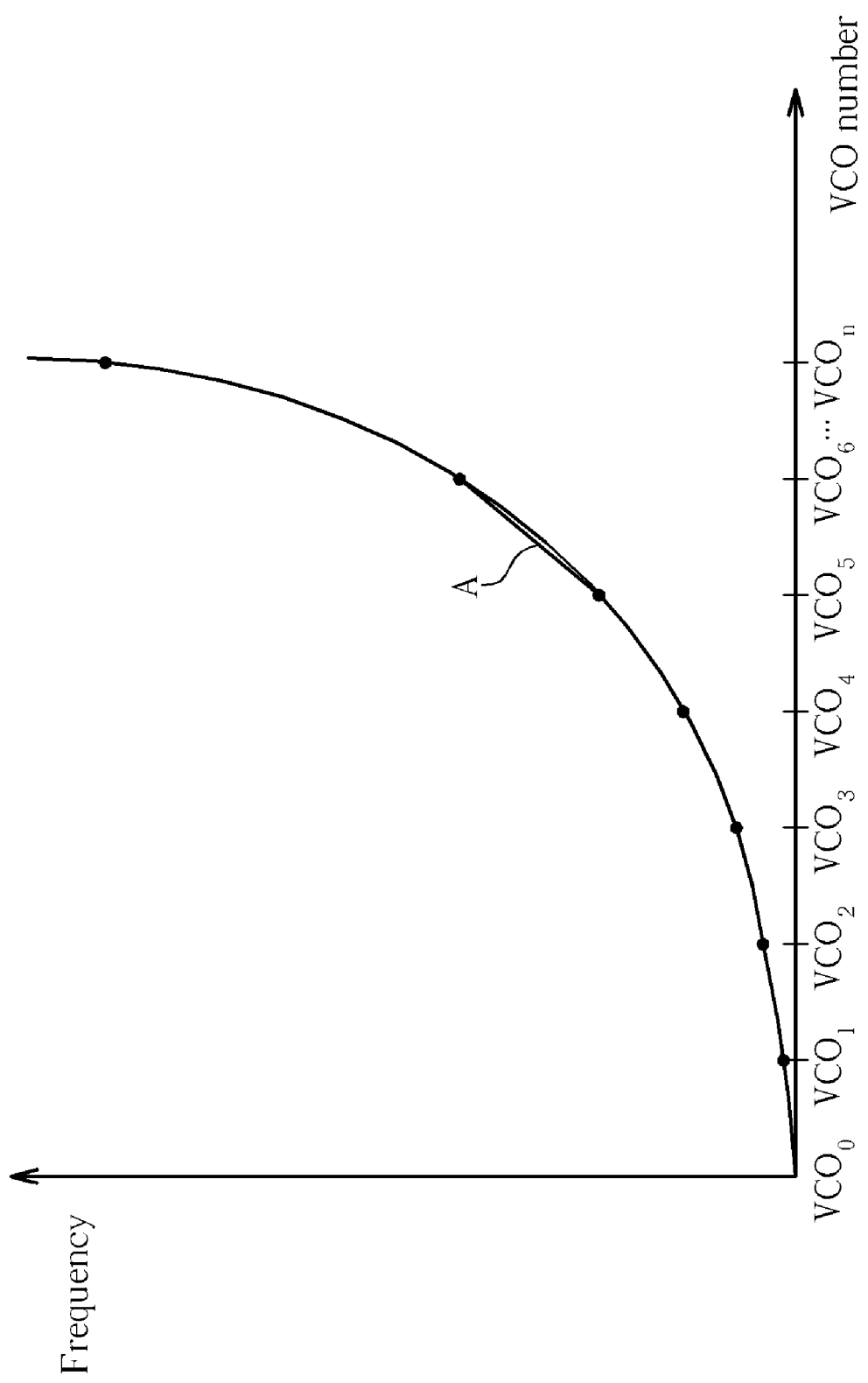
FIG. 2 is an example graph of frequency versus VCO.

Please refer to FIG. 2, which is a graph of frequency verses VCO in an example frequency synthesizer system with multi-band VCOs. The vertical axis represents increasing frequency and the horizontal axis represents different VCOs ranging from VCO0 to VCOn. As is understood by those skilled in the art, the frequency response of VCOs VCO0 through VCOn is not linear, but follow an $X^2$ curve, with the center frequency of each VCO theoretically falling on the curve. As can be seen in from line A in FIG. 2, interpolating between the respective center frequencies of any two VCOs normally will not give a completely accurate estimation of the true value, but it often is accurate enough to be useful in a system requiring high speed tracking and locking. For example, interpolation between the frequencies generated by VCO3 and VCO5 would give an estimated frequency slightly higher than that actually generated by VCO4, but would be within the linear range of possible frequencies that VCO4 is able to generate and is therefore accurate enough for our purposes. Obviously the accuracy of the interpolation depends upon the number of VCOs utilized in the system and how many of those VCOs are utilized as interpolation points. It is finding the proper balance between speed and accuracy that enables successful tracking and locking at the high speeds required by some systems.

Figure 3:
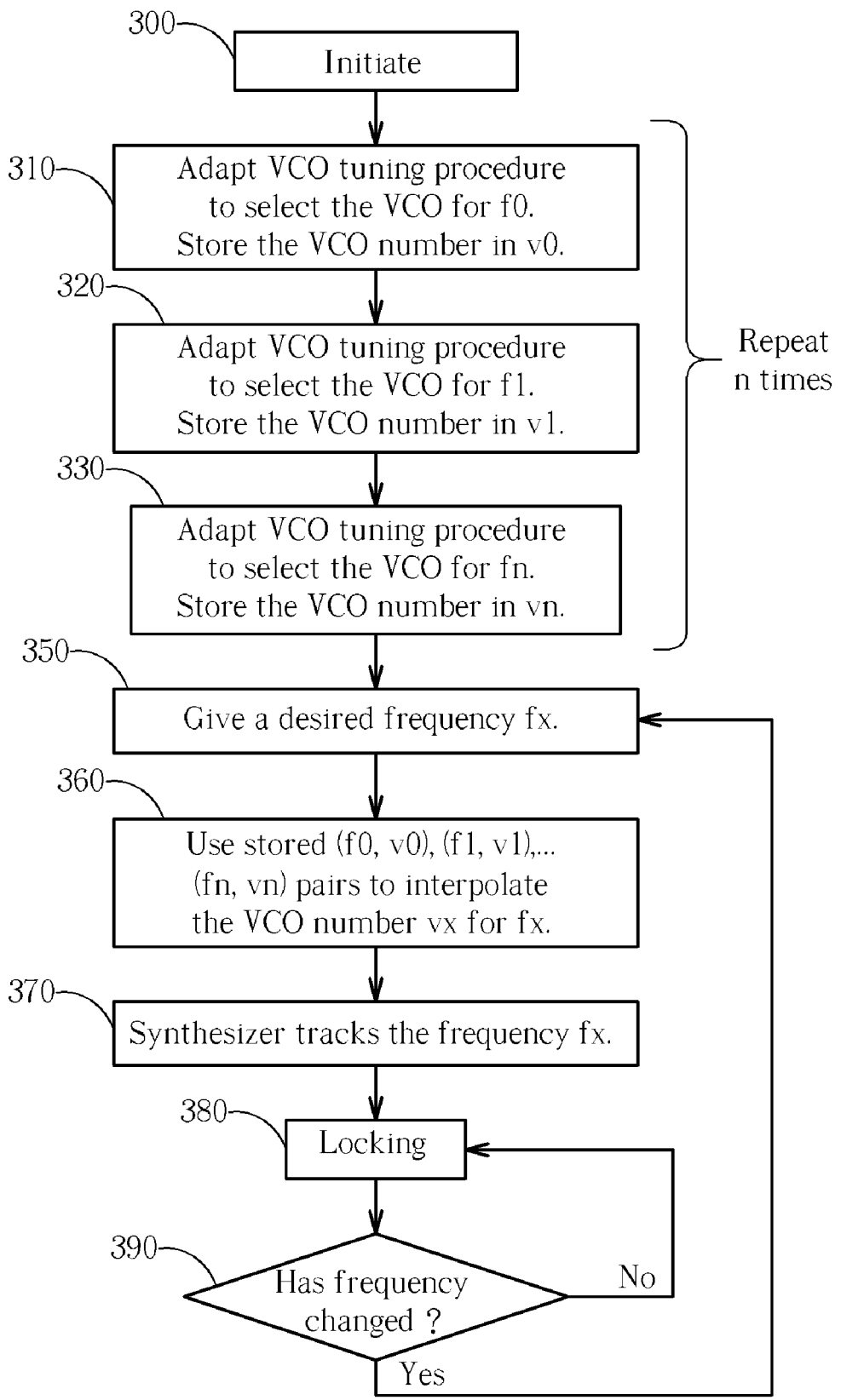
FIG. 3 is a flow chart of automatic frequency tuning according to the present invention.

Please refer to FIG. 3, which is a flow chart of automatic frequency tuning according to the present invention. The system is initiated in Step 300. Steps 310 through 330 will be explained in greater detail a little later. The legend "Repeat n times" to the right of Steps 310 through 330 does not mean that the series of steps is repeated n times. What is meant by "Repeat n times" is that there will be one corresponding step for each VCO that is to be pre-calibrated as an interpolation point. For example, if there are 3 VCOs to be pre-calibrated, there will be three steps, each step performed once. If there are 8 VCOs to be pre-calibrated, there will be 8 steps with each step performed once.

Once the VCOs have been pre-calibrated, the system is ready to be given a desired frequency fx in Step 350. In Step 360, stored (frequency, VCO) pairs are utilized to interpolate the specific VCO estimated to be best able to generate the desired frequency. One possible formula that may be used for the interpolation is ((VCO0*(C1−Cd)+(VCO1*(Cd−C0))/(C1−C0) where VCO0 is the pre-calibrated VCO whose frequency is most nearly but below the desired frequency, VCO1 is the pre-calibrated VCO whose frequency is most nearly but above the desired frequency, Cd is the desired channel, C0 is the channel generated by VCO, and C1 is the channel generated by VCO1. For example, if channel 50 is desired and given the (32, VCO23) and (64, VCO51) pairs, the above formula would select VCO number (23*(64−50)+51*(50−32))/(64−32). This particular example yields VCO 38.75, which of course would be rounded up or down according to design considerations.

Once the appropriate VCO has been selected via the interpolation procedure, the synthesizer tracks the desired frequency fx in Step 370, and locking takes place in Step 380. The frequency remains locked in Step 390 until the frequency is changed.

Referring now back to Steps 310 through 330 of FIG. 3, pre-calibration may be best illustrated with the use of the following example. However, it is to be understood that the following in only an example and the spirit and content of this disclosure and claims are not to be limited by any specifics in the following example. Other means of selecting appropriate pre-calibration VCOs, other quantities if interpolation points, other frequency ranges, the use of other systems, and etc. also falls within the intended scope of the present disclosure.

In the example, suppose a system requires the initial frequency lock time to be less than 500 micro-seconds. Because some spare time is needed by the analog circuit to stabilize and for the phase lock loop to stabilize, the allowed 500 micro-seconds is functionally reduced to about 400 micro-seconds for pre-calibration. If it takes at most 35 micro-seconds for the circuitry and algorithm to pre-calibrate a frequency for a single interpolation point VCO, then the system can pre-calibrate no more than 400/35=11 frequencies (interpolation point VCOs). Suppose that the frequency range is about 1875 MHz through 1933 MHz, with channel spacing of 300 kHz. If it is desired to calibrate 11 frequencies, the spacing between the frequencies is (1933−1875)/10=5.8 MHz. For simplicity's sake, assume the spacing between the frequencies is 6 MHz, which is 20 times the 300 kHz channel spacing. The 6 MHz can be seen as a linear variation for each VCO.

For internal calculation, it is desirable to make 150 kHz a unit, thus making 40 pre-calibration frequency spacings so as to simplify interpolation. However division by 40 requires dividers that are expensive and occupy large hardware areas and should be avoided if possible. In practice, it is far preferable to make divisors a power of 2 so that division can be achieved by shifts since shifts do not occupy any hardware area. It is hoped that the pre-calibration frequency spacing is 32 or 64 ranges of 150 kHz. If 32 is selected, then there will be 13 frequencies needing to be pre-calibrated, which exceeds the maximum number of 11 permitted due to time constraints. If 64 is selected, then 7 frequencies need to be pre-calibrated and frequency spacing is 9.6 MHz, which is still within VCO linear range.

Once the number of VCOs to be pre-calibrated is known (7 in the above example), it is a simple matter of selecting the VCOs to be pre-calibrated so that they are appropriately spaced throughout the larger, full bank of VCOs within the automatic frequency synthesizer system. Then the VCOs that are to be pre-calibrated are supplied a predetermined voltage, which is 1.4 volts in one embodiment of the present invention but is subject to design considerations. The predetermined voltage remains the same for each VCO during pre-calibration to save time. For each of the pre-calibrated VCOs, the frequency generated at the predetermined voltage is paired with the number of the generating VCO as a (frequency, VCO) pair and the values are stored into memory, perhaps in the form of a lookup table but other storage methods may work equally as well. At this point in time, pre-calibration is complete and the system is ready to begin Step 350 of FIG. 3 and be given a desired frequency.

Figure 4:
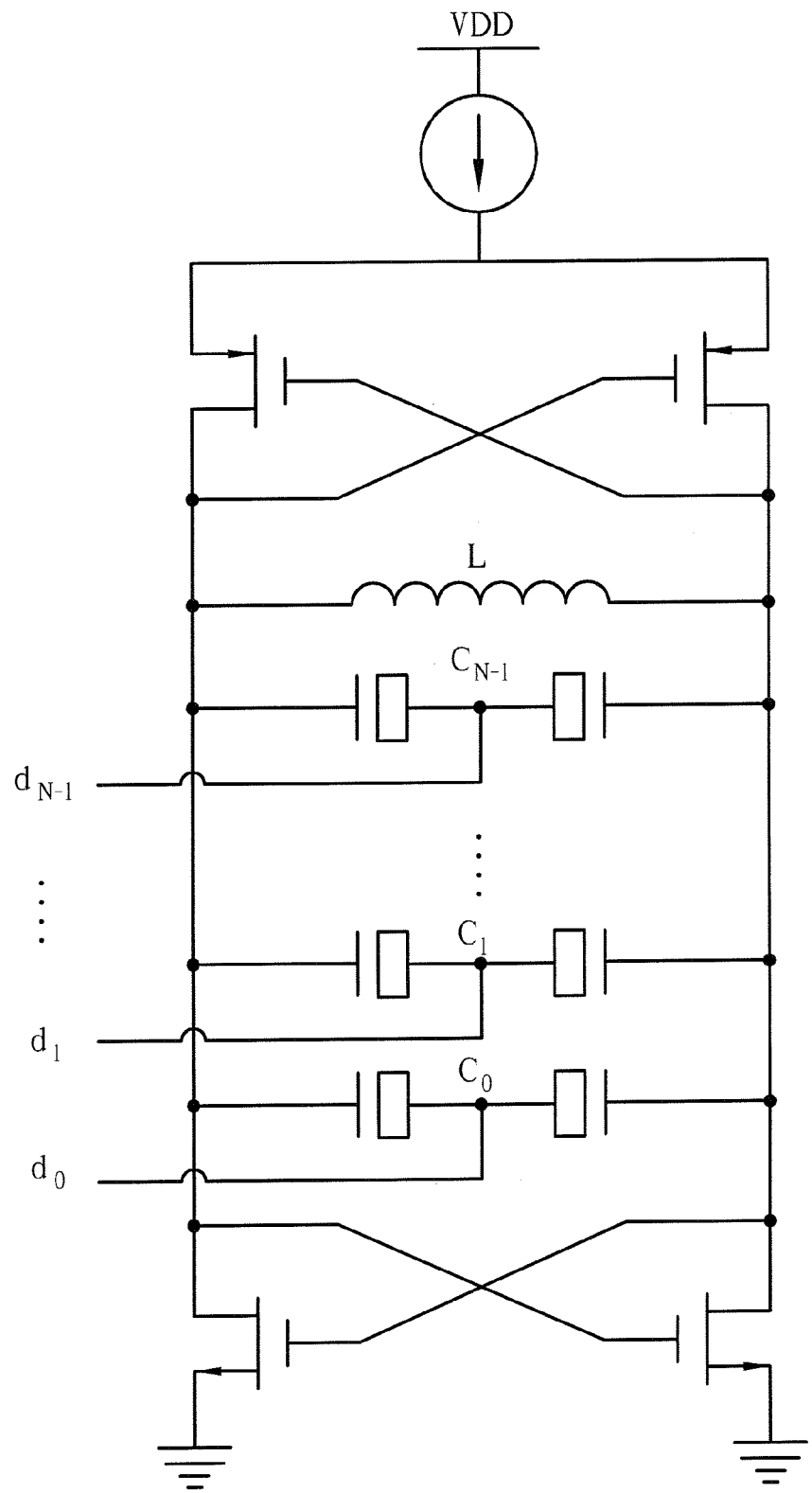
FIG. 4 is an illustration of a typical multiband VCO.

Once the desired frequency is known, the (frequency, VCO) pairs most adjacent to the desired frequency are utilized to interpolate the estimated VCO number that is selected to generate the desired frequency. It should be noted that each VCO in the bank of VCOs is connected with a switch so that only the one selected VCO is generating a frequency at any given time and all other VCOs are effectively disconnected from the system by their respective switches. FIG. 4 shows one method of accomplishing this by illustrating a typical multiband VCO having N capacitors (CN-1, . . . , C1, C0), each of the n capacitors having a control signal (dn-1, . . . , d1, d0) connected to either VDD or GND. The combinations of the N control signals form 2^N VCOs and each has a different frequency characteristic due to the different capacitance with the control signals acting as the respective switches.

The present invention discloses a new and unique method of automatic frequency pre-calibration and synthesis suitable for use in multi-band VCO wireless systems having very limited initial frequency lock times. To enable very rapid selection of the appropriate VCO to generate the desired frequency, a predetermined plurality of VCOs out of a larger bank of VCOs is selected to serve as interpolation points. The interpolation point VCOs are pre-calibrated with a predetermined voltage and the resultingly generated frequencies are stored into memory as (frequency, VCO) pairs, one pair for each interpolation point VCO. When a desired frequency is given to the system, an appropriate VCO is selected by interpolation using the (frequency, VCO) pairs of the two most adjacent interpolation points VCOs. The present invention saves time by eliminating the need of calibrated each VCO and/or recursive scanning and VCO range limitations, achieving improved initial frequency lock times.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of automatic frequency tuning in a multi-band voltage controlled oscillator (VCO) system, the method comprising:

selecting a plurality of frequencies among a desired frequency band;

selecting a plurality of interpolation point VCOs out of a larger plurality of VCOs, selection of each of the interpolation point VCOs determined by results of a pre-calibration to be most suitable for generating one of the selected plurality of frequencies;

generating a corresponding frequency/VCO pair for each of the interpolation point VCOs;

interpolating between the frequency/VCO pairs corresponding to two interpolation point VCOs most adjacent to a desired frequency to select a VCO for generating the desired frequency; and tracking and locking utilizing the selected VCO.

2. The method of claim 1 wherein the pre-calibration of the interpolation point VCOs is performed utilizing a same predetermined voltage for each of the interpolation point VCOs.

3. The method of claim 2 wherein the predetermined voltage is 1.4 volts.

4. The method of claim 1 wherein the frequency/VCO pairs are stored in a lookup table in memory.

5. The method of claim 1 wherein each of the larger plurality of VCOs is electrically connected to the system with a corresponding switch and all non-selected VCOs are electrically disconnected from the system during tracking and locking utilizing the corresponding switch.

6. The method of claim 5 wherein the VCO that is selected for generating the desired frequency is selected according to the equation of $((VCO0*(C1-Cd)+(VCO1*(Cd-C0))/(C1-C0)$ where $(C0, VCO0)$ and $(C1, VCO1)$ are frequency /VCO pairs, a frequency $C0$ is closest to but below the desired frequency, a frequency $C1$ is closest to but above the desired frequency, and $Cd$ is the desired channel.

7. A device that utilizes the method of claim 5.

8. A method of automatic frequency tuning in a multi-band voltage controlled oscillator (VCO) system, the method comprising:

a means for selecting a plurality of frequencies among a desired frequency band;

a means for selecting a plurality of interpolation point VCOs out of a larger plurality of VCOs, selection of each of the interpolation point VCOs determined by results of a pre-calibration to be most suitable for generating one of the selected plurality of frequencies;

generating a corresponding frequency/VCO pair for each of the interpolation point VCOs;

a means for interpolating between the frequency/VCO pairs corresponding to two interpolation point VCOs most adjacent to a desired frequency to select a VCO for generating the desired frequency; and tracking and locking utilizing the selected VCO.

9. The method of claim 8 wherein the pre-calibration of the interpolation point VCOs is performed utilizing a same predetermined voltage for each of the interpolation point VCOs.

10. The method of claim 9 wherein the predetermined voltage is 1.4 volts.

11. The method of claim 8 wherein the frequency/VCO pairs are stored in a lookup table in memory.

12. The method of claim 8 wherein each of the larger plurality of VCOs is electrically connected to the system with a corresponding switch and all non-selected VCOs are electrically disconnected from the system during tracking and locking utilizing the corresponding switch.

13. A device that utilizes the method of claim 12.

14. A method of automatic frequency tuning in a multi-band voltage controlled oscillator (VCO) system, the method comprising:

selecting a plurality of interpolation point VCOs out of a larger plurality of VCOs;

pre-calibrating the interpolation point VCOs to generate corresponding frequency/VCO pairs;

interpolating between the frequency/VCO pairs corresponding to two interpolation point VCOs most adjacent to a desired frequency to select a VCO for generating the desired frequency; and tracking and locking utilizing the selected VCO;

wherein the pre-calibration of the interpolation point VCOs is performed utilizing a same predetermined voltage for each of the interpolation point VCOs.

15. The method of claim 14 wherein each of the larger plurality of VCOs is electrically connected to the system with a corresponding switch and all non-selected VCOs are electrically disconnected from the system during tracking and locking utilizing the corresponding switch.

16. The method of claim 14 wherein the VCO that is selected for generating the desired frequency is selected according to the equation of $((VCO0*(C1-Cd)+(VCO1*(Cd-C0))/(C1-C0)$ where $(C0, VCO0)$ and $(C1, VCO1)$ are frequency /VCO pairs, a frequency $C0$ is closest to but below the desired frequency, a frequency $C1$ is closest to but above the desired frequency, and $Cd$ is the desired channel.

* * * * *